US011101714B2

(12) United States Patent
Lin et al.

(10) Patent No.: US 11,101,714 B2
(45) Date of Patent: Aug. 24, 2021

(54) BRUSHLESS DC MOTOR FAN

(71) Applicant: Delta Electronics, Inc., Taoyuan (TW)

(72) Inventors: Chih-Wei Lin, Taoyuan (TW);
Chin-Chun Lai, Taoyuan (TW);
Seng-En Mai, Taoyuan (TW); Kun-Fu Chuang, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 287 days.

(21) Appl. No.: 16/117,422

(22) Filed: Aug. 30, 2018

(65) Prior Publication Data
US 2019/0089219 A1    Mar. 21, 2019

(30) Foreign Application Priority Data

Sep. 15, 2017  (CN) .......................... 201710834757.4

(51) Int. Cl.
*H02K 5/22*     (2006.01)
*H02K 19/10*    (2006.01)
(Continued)

(52) U.S. Cl.
CPC ......... *H02K 5/225* (2013.01); *F04D 25/0606* (2013.01); *F04D 25/0646* (2013.01); *H02K 3/47* (2013.01); *H02K 11/33* (2016.01); *H02K 15/0068* (2013.01); *H02K 15/02* (2013.01); *H02K 15/04* (2013.01); *H02K 19/10* (2013.01); *H02K 21/222* (2013.01); *H05K 1/181* (2013.01); *H05K 3/32* (2013.01); *H02K 7/003* (2013.01); *H02K 2203/03* (2013.01); *H02K 2203/09* (2013.01); *H05K 2201/1009* (2013.01); *H05K 2201/10083* (2013.01)

(58) Field of Classification Search
CPC .......... H02K 5/22; H02K 15/02; H02K 15/04; H02K 19/10; H02K 21/222; H02K 11/33; H02K 3/47; H02K 15/0068; H02K 5/225; F04D 25/06; F04D 25/0606; F04D 25/0646; H05K 1/181; H05K 1/18; H05K 3/32
See application file for complete search history.

(56) References Cited

U.S. PATENT DOCUMENTS 4,167,692 A * 9/1979 Sekiya ................... H02K 29/08
                                                    310/268
5,005,281 A * 4/1991 Burns ................. H02K 15/024
                                                    29/415
(Continued)

FOREIGN PATENT DOCUMENTS

CN         201499025 U      6/2010
CN         101931300 A     12/2010
(Continued)

OTHER PUBLICATIONS

Office Action dated Jan. 19, 2020 in CN Application No. 201710834757.4 (9 pages).

*Primary Examiner* — Naishadh N Desai
(74) *Attorney, Agent, or Firm* — Muncy, Geissler, Olds and Lowe, P.C.

(57) ABSTRACT

A brushless DC motor fan is provided. The brushless DC motor fan includes a rotor and a stator module. The rotor has a shaft disposed on an inner side of the stator module and rotating relative to the stator module. The stator module has a coreless coil and a lead frame, wherein the lead frame includes six pins electrically connected to the coreless coil.

18 Claims, 10 Drawing Sheets

(51) Int. Cl.
  *H02K 15/02* (2006.01)
  *H02K 15/04* (2006.01)
  *H05K 1/18* (2006.01)
  *F04D 25/06* (2006.01)
  *H05K 3/32* (2006.01)
  *H02K 3/47* (2006.01)
  *H02K 11/33* (2016.01)
  *H02K 15/00* (2006.01)
  *H02K 21/22* (2006.01)
  *H02K 7/00* (2006.01)

(56) References Cited

U.S. PATENT DOCUMENTS

| | | | | |
|---|---|---|---|---|
| 5,146,144 A * | 9/1992 | Lee | ................. | H02K 7/20 |
| | | | | 310/156.34 |
| 5,265,320 A * | 11/1993 | Greenway | ............. | B21D 28/22 |
| | | | | 29/596 |
| 8,476,800 B2 * | 7/2013 | Lai | ................. | H02K 21/24 |
| | | | | 310/179 |
| 2004/0074356 A1 * | 4/2004 | Abnet | ................. | B21D 28/06 |
| | | | | 83/55 |
| 2004/0108789 A1 * | 6/2004 | Marshall | ................. | H02K 1/24 |
| | | | | 310/216.016 |
| 2006/0238071 A1 * | 10/2006 | Kawasaki | ............. | H02K 15/02 |
| | | | | 310/321 |
| 2006/0261684 A1 * | 11/2006 | Sonohara | ............. | H02K 5/225 |
| | | | | 310/49.08 |
| 2008/0116756 A1 * | 5/2008 | Chang | ................. | H02K 1/12 |
| | | | | 310/90 |
| 2009/0058233 A1 * | 3/2009 | Yajima | ................. | H02K 1/145 |
| | | | | 310/49.32 |
| 2013/0134818 A1 * | 5/2013 | Jan | ................. | H02K 3/12 |
| | | | | 310/156.32 |
| 2013/0154436 A1 * | 6/2013 | Nakano | ................. | B62D 5/046 |
| | | | | 310/216.094 |
| 2015/0288247 A1 * | 10/2015 | Lee | ................. | H02K 7/08 |
| | | | | 310/68 B |
| 2016/0330342 A1 * | 11/2016 | Kinoshita | ................. | B41J 2/01 |
| 2016/0380522 A1 * | 12/2016 | Woo | ................. | H02K 1/2706 |
| | | | | 310/68 B |
| 2018/0002575 A1 * | 1/2018 | Sato | ................. | C09J 9/02 |

FOREIGN PATENT DOCUMENTS

| | | |
|---|---|---|
| CN | 205195441 U | 4/2016 |
| CN | 106787333 A | 5/2017 |

* cited by examiner

BRUSHLESS DC MOTOR FAN

CROSS REFERENCE TO RELATED APPLICATIONS

This application claims the benefit of priority from Chinese Patent Application No. 201710834757.4, filed with State Intellectual Property Office, P. R. C. on Sep. 15, 2017, and the entirety of which is incorporated by reference herein.

BACKGROUND

Technical Field

The disclosure relates to a brushless DC motor fan, and in particular to a brushless DC motor fan with a coreless coil and a lead frame.

Description of the Related Art

Conventionally, to produce a micro fan, a stator of the micro fan is produced by winding a coil on a lead of a silicon steel element, and then the stator is manually assembled and welded to a circuit board. However, when this process is utilized to produce a micro fan with a smaller size, the manual failure may cause welding defect to produce poor electrical performance.

SUMMARY

The present disclosure provides a brushless DC motor fan. The brushless DC motor fan includes a rotor and a stator module. The rotor has a shaft disposed on an inner side of the stator module and rotating relative to the stator module. The stator module has a coreless coil and a lead frame, wherein the lead frame includes six pins electrically connected to the coreless coil.

In one embodiment, the rotor further includes a magnet disposed related to the stator module.

In one embodiment, the brushless DC motor fan further comprises a case and a circuit board. The case includes a base, the coreless coil is disposed on a side of the base, and the six pins are electrically connected to the circuit board.

In one embodiment, the circuit board and the coreless coil are disposed on the same side of the base.

In one embodiment, the circuit board has an opening to receive the shaft.

In one embodiment, the circuit board and the coreless coil are disposed on the opposite sides of the base.

In one embodiment, the circuit board has a plurality of holes to receive the six pins.

In one embodiment, the stator module further includes a motor core disposed on the inner side of the stator module and between the coreless coil and the shaft.

In one embodiment, a plurality of grooves are formed at an inner surface of the motor core.

In another embodiment, the present disclosure provides a manufacturing method of a brushless DC motor fan. The manufacturing method of a brushless DC motor fan includes the following steps: providing a coreless coil; providing a lead frame plate having a lead frame; disposing the coreless coil on the lead frame plate and electrically connecting the coreless coil to the lead frame; packaging the coreless coil and the lead frame to form a stator module plate; cutting the stator module plate to form a stator module; providing a rotor having a shaft and disposing the shaft on an inner side of the stator module; and providing a circuit board and electrically connecting the stator module to the circuit board, wherein the stator module is electrically connected to the circuit board via six pins.

In one embodiment, the coreless coil is electrically connected to the lead frame by welding.

In one embodiment, the manufacturing method of a brushless DC motor fan, further includes the following steps: providing a motor core and disposing the motor core on an inner side of the coreless coil; and packaging the coreless coil and the lead frame to form the stator module plate.

In one embodiment, a plurality of grooves are formed at an inner surface of the motor core.

In one embodiment, the circuit board has an opening to receive the shaft.

In one embodiment, the circuit board has a plurality of holes to receive the six pins.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

The brushless DC motor fan and the manufacturing method of a brushless DC motor fan of the present disclosure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

Figure 1A:
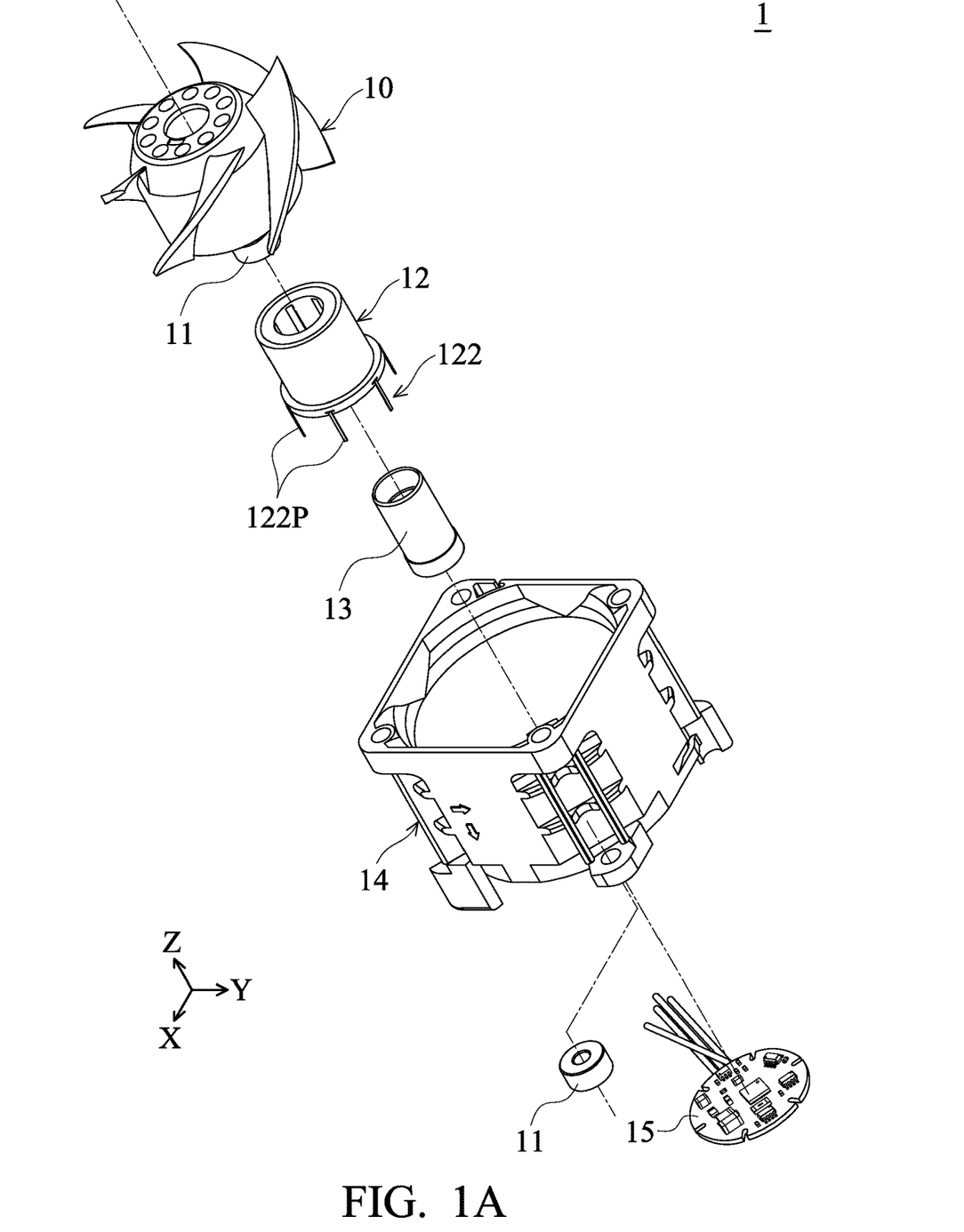
FIG. 1A is an exploded view of a brushless DC motor fan in accordance with one embodiment of the present disclosure.
Figure 1B:
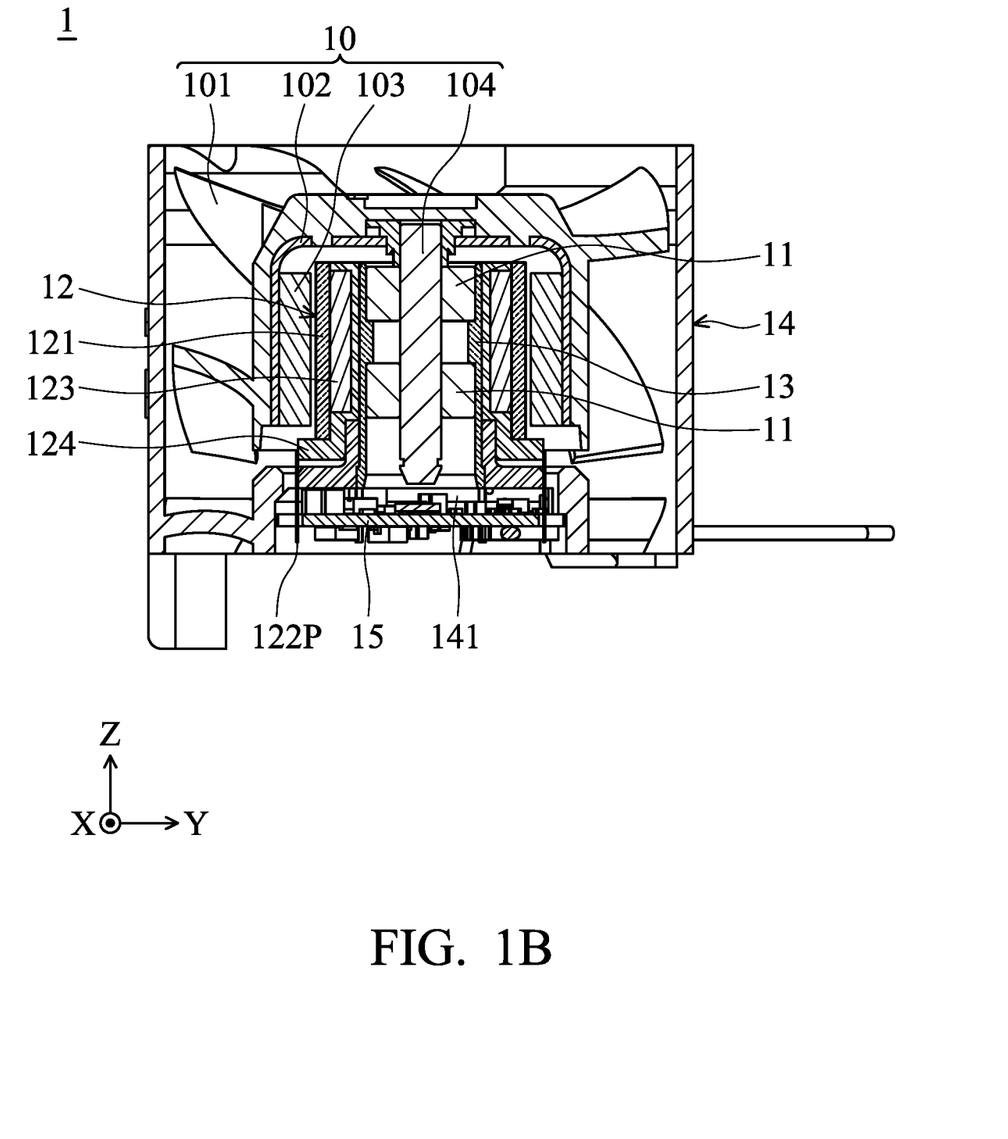
FIG. 1B is a schematic cross-sectional view of the brushless DC motor fan in FIG. 1A after assembling.

Referring to FIGS. 1A and 1B, the brushless DC motor fan 1 includes a rotor 10, a bearing 11, a stator module 12, a shaft sleeve 13, a fan housing 14 and a circuit board 15. The rotor 10 includes a shaft 104, and the stator module 12 includes a coreless coil 121 and a lead frame 122. The lead frame 122 is disposed on a lower side of the coreless coil 121. The shaft 104 is disposed on an inner side of the stator module 12 and passes through the coreless coil 121 and the lead frame 122. It should be noted that, the stator module 12 has six pins 122P for providing the driving current to the brushless DC motor fan used for a three-phase motor.

In this embodiment, the rotor 10 further includes a blade wheel 101, a yoke 102 and a magnet 103. The yoke 102 is disposed between the magnet 103 and the blade wheel 101. The shaft sleeve 13 is fixed in the fan housing 14, and the shaft 104 passes through the bearing 11 and is disposed in the shaft sleeve 13. In this way, the shaft sleeve 13 is disposed between the shaft 104 and the stator module 12, and the stator module 12 is fixed on the fan housing 14 by the shaft sleeve 13. The magnet 103 is disposed corresponding to the stator module 12.

Still referring to FIGS. 1A and 1B. In this embodiment, the fan housing 14 includes a base 141. The rotor 10 and the coreless coil 121 are disposed on a side of the base 141, and the circuit board 15 and the coreless coil 121 are disposed on the opposite sides of the base 141. The six pins 122P extends to pass through the base 141 and electrically connected to the circuit board 15. Therefore, the circuit board 15 has a plurality of holes to receive the six pins 122P. Since the circuit board 15 and the rotor 10 are disposed on the opposite sides of the base 141, the design space of the motor is larger. Furthermore, the circuit board 15 only has the holes to receive the six pins 122P, the area for the electric element on the circuit board 15 is sufficient.

Figure 2A:
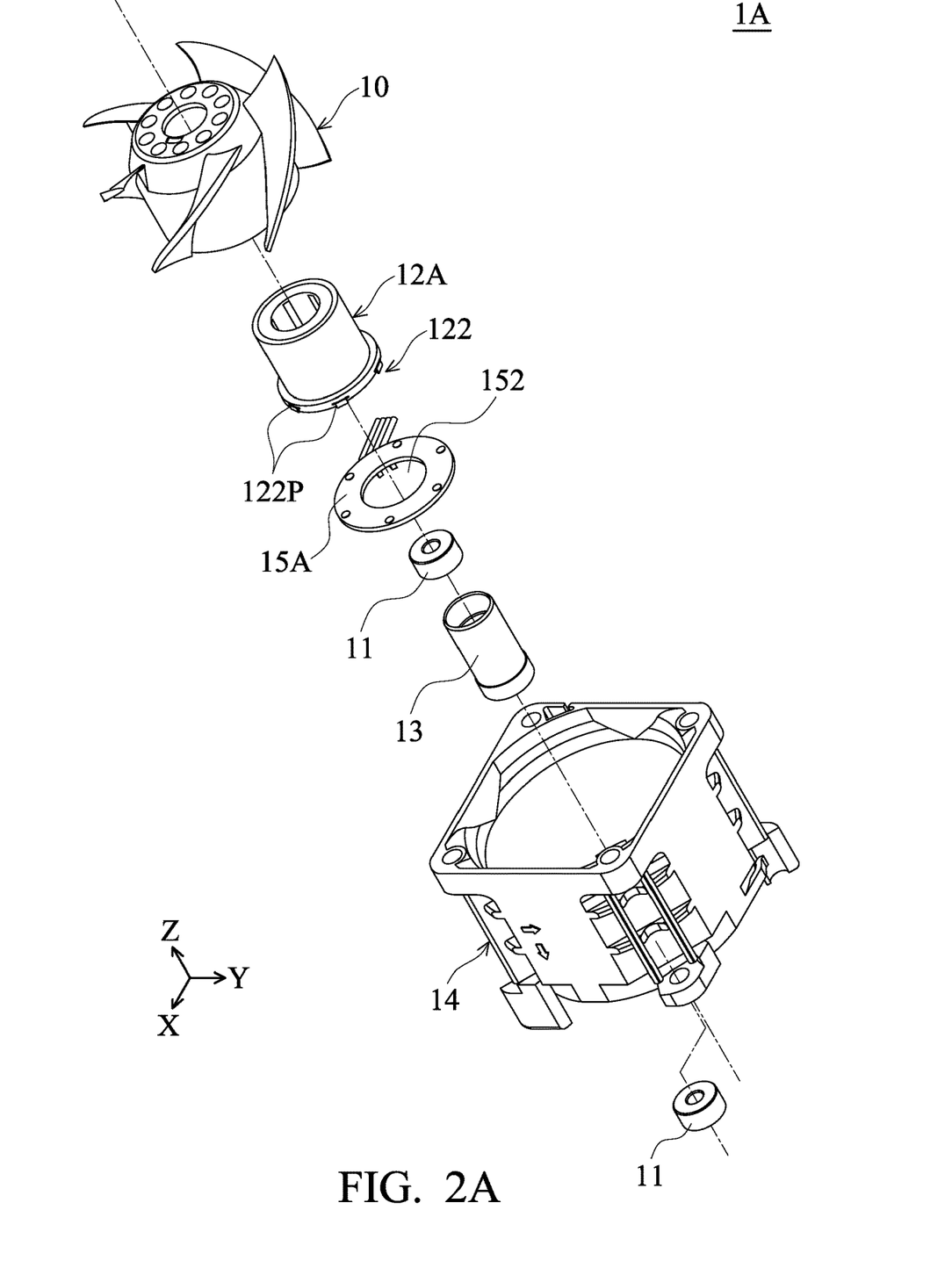
FIG. 2A is an exploded view of a brushless DC motor fan in accordance with another embodiment of the present disclosure.
Figure 2B:
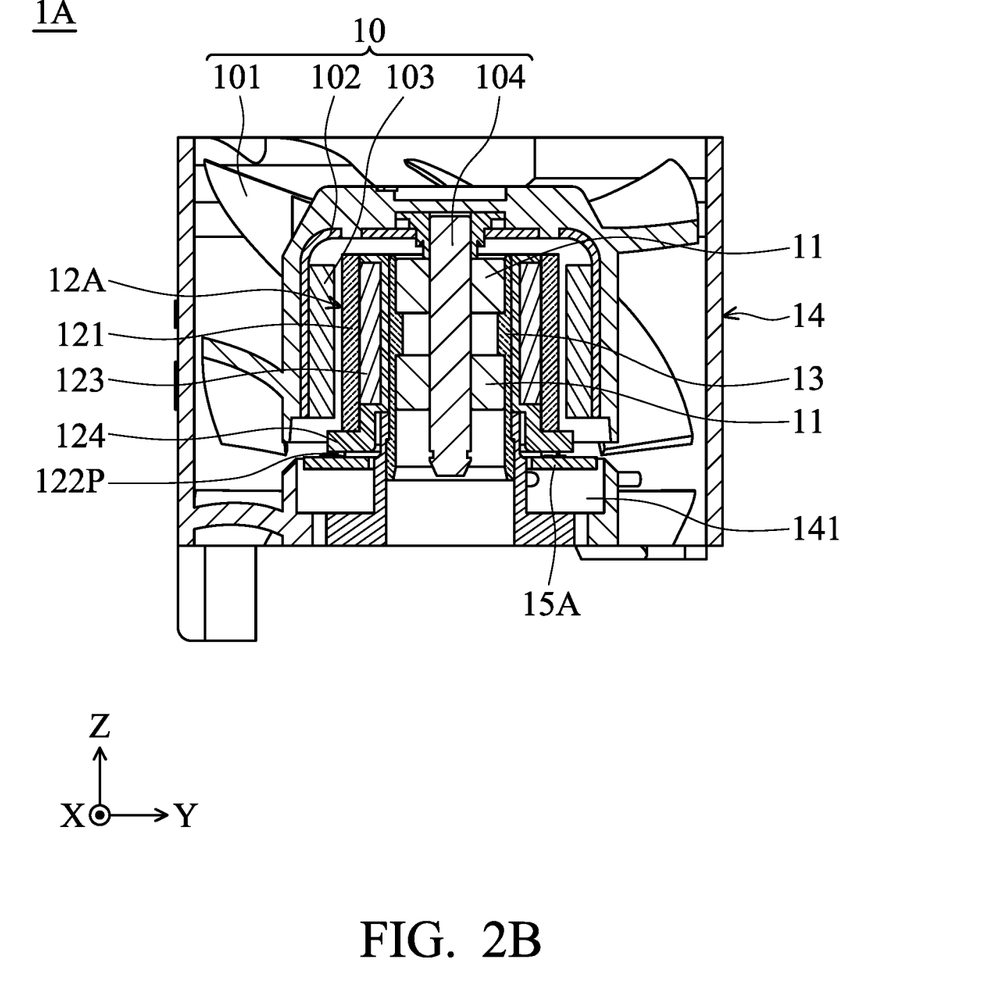
FIG. 2B is a schematic cross-sectional view of the brushless DC motor fan in FIG. 2A after assembling.

FIGS. 2A and 2B are showing a brushless DC motor fan 1A in accordance with another embodiment of the present disclosure. The difference between this embodiment and the embodiment of FIG. 1A FIG. 1B is that the circuit board 15A and the stator module 12A are disposed on the same side of the base 141. Therefore, the circuit board 15A has an opening 152 to receive the shaft 104, and the six pins 122P of the stator module 12A are electrically connected to the circuit board 15A by surface mount technology (SMT). Since the circuit board 15A and the rotor 10 are disposed on the same side of the base 141, the volume of the motor could be reduced.

Figure 3A:
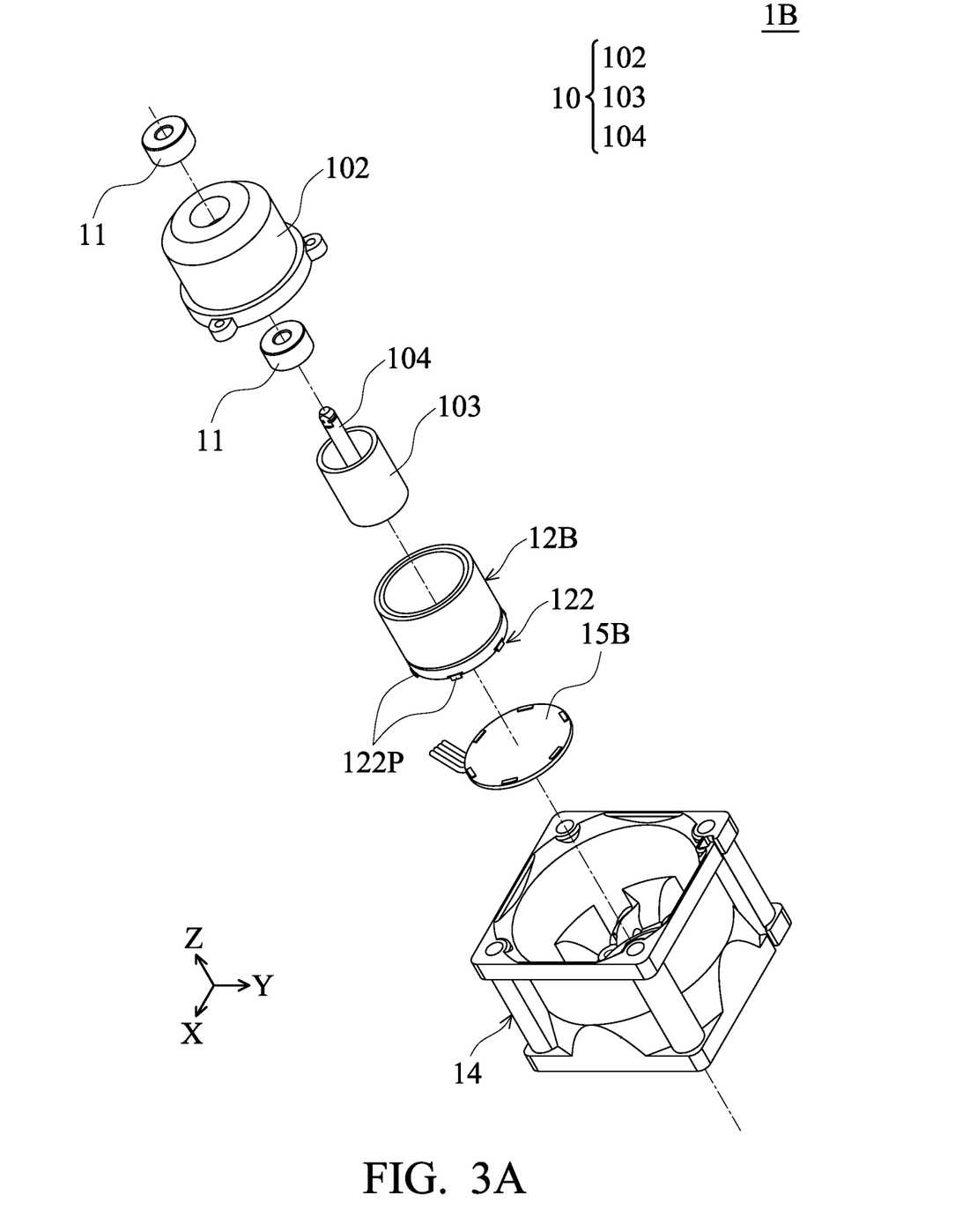
FIG. 3A is an exploded view of a brushless DC motor fan in accordance with another embodiment of the present disclosure.
Figure 3B:
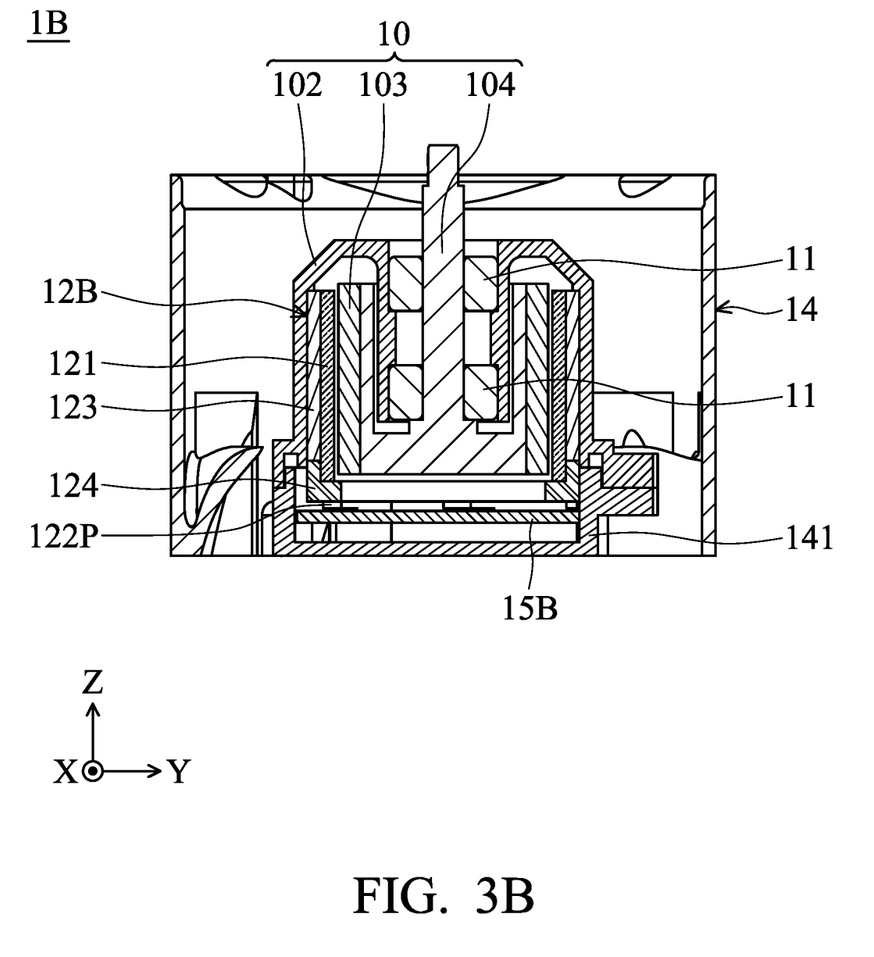
FIG. 3B is a schematic cross-sectional view of the brushless DC motor fan in FIG. 3A after assembling.

FIGS. 3A and 3B are showing a brushless DC motor fan 1B in accordance with another embodiment of the present disclosure. The difference between this embodiment and the embodiments of FIGS. 1A, 1B, 2A and 2B is that the magnet 103 is disposed on an inner side of the stator module 12B used for the inner rotor motor. In addition, the circuit board 15B and the stator module 12B are disposed on the same side of the base 141, but the circuit board 15B does not have an opening to receive the shaft 104. The six pins 122P of the stator module 12B are also electrically connected to the circuit board 15B by surface mount technology (SMT).

Figure 4A:
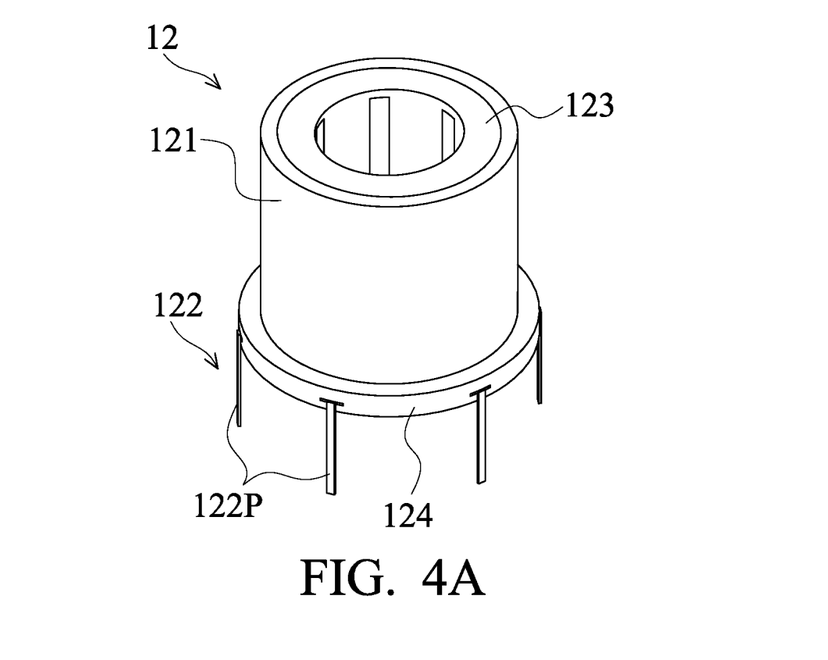
FIG. 4A is a schematic perspective view of the stator module in FIG. 1A.

Referring to FIG. 4A. FIG. 4A is a schematic perspective view of the stator module in FIG. 1A. As shown in the embodiment of FIGS. 1A and 1B, the six pins 122P of the lead frame 122 extends and passes through the base 141 to electrically connected to the circuit board 15, so the length of the six pins 122P may be greater than the thickness of the base 141 and the circuit board 15 to ensure being electrically connected to the circuit board 15.

Still referring to FIG. 4A. In this embodiment, the stator module 12 further includes a motor core 123 and a packaging material 124. The motor core 123 is disposed on an inner side of the coreless coil 121, and the packaging material 124 is disposed on the top and the bottom of the coreless coil 121 to fix and protect the coreless coil 121, the motor core 123 and the lead frame 122. The packaging material 124 may include insulating material. The insulating material includes polymer material such as plastic or resin.

Figure 4B:
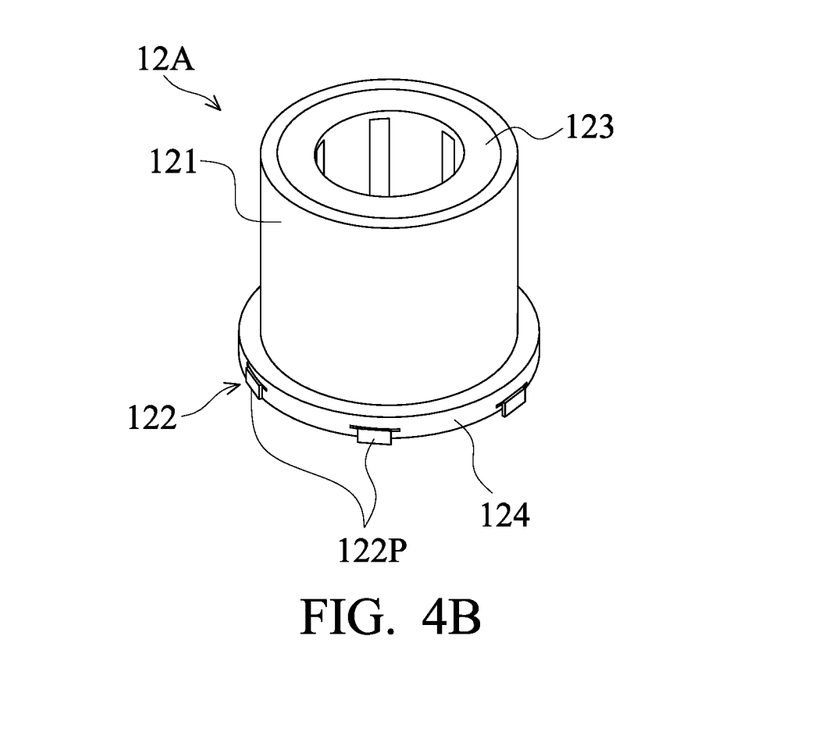
FIG. 4B is a schematic perspective view of the stator module in FIG. 2A.

FIG. 4B is a schematic perspective view of the stator module 12A shown in FIG. 2A. The difference between this embodiment and that of FIG. 4A is that the six pins 122P of the lead frame 122 is electrically connected to the circuit board 15 by surface mount technology (SMT). The six pins 122P could be surface mount device (SMD) shown in FIG. 4B and the length of the six pins 122P could be reduce.

Figure 5A:
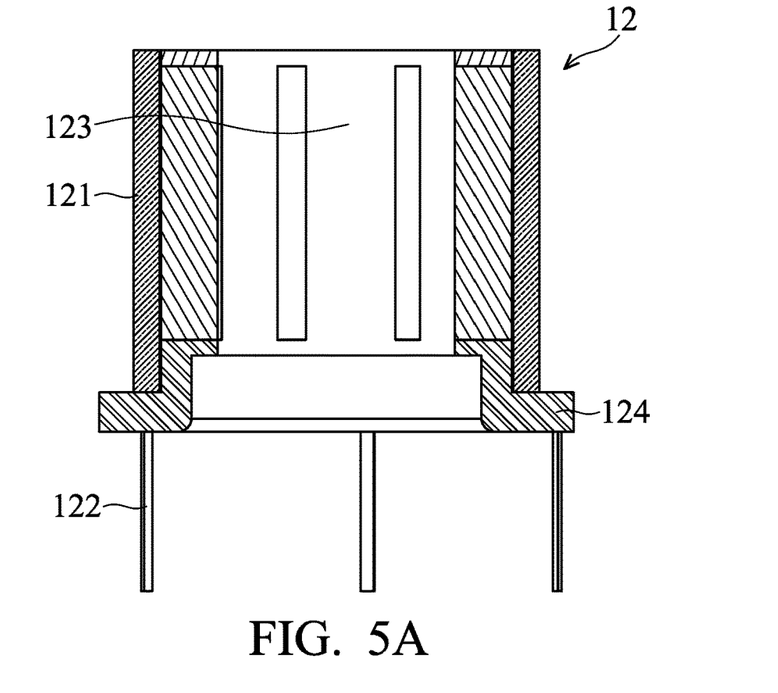
FIG. 5A is a schematic axial-sectional view of the stator module in FIG. 4A.
Figure 5B:
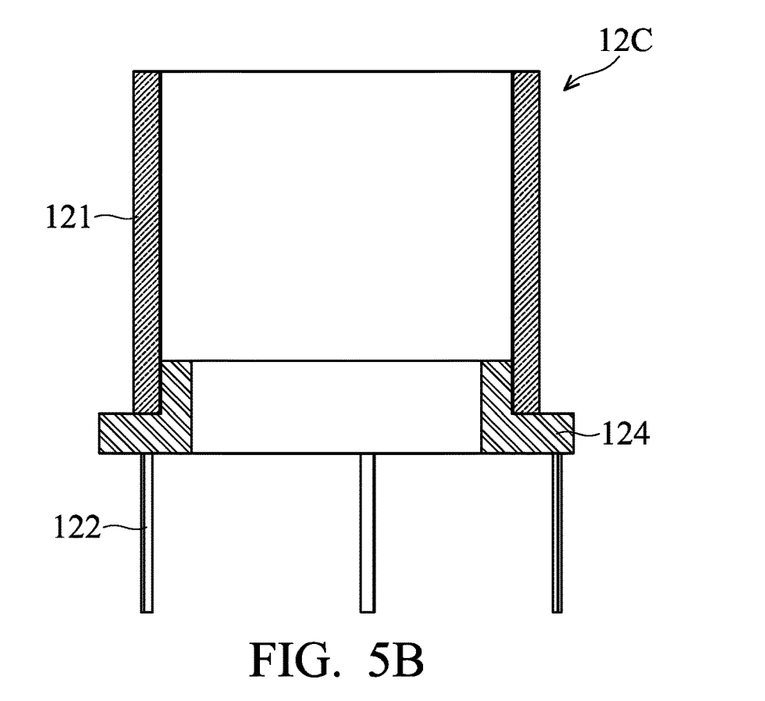
FIG. 5B is a schematic axial-sectional view of a stator module in accordance with another embodiment of the present disclosure.

FIGS. 5A and 5B are schematic axial-sectional views of the stator modules 12 and 12C, respectively. As shown in FIG. 5A, the motor core 123 is disposed on the inner side of the coreless coil 121 and packaged to form the stator module 12 with the lead frame 122 by the packaging material 124. Furthermore, as shown in FIG. 5B, only the coreless coil 121 and the lead frame 122 are packaged to form the stator module 12C by the packaging material 124.

Figure 6A:
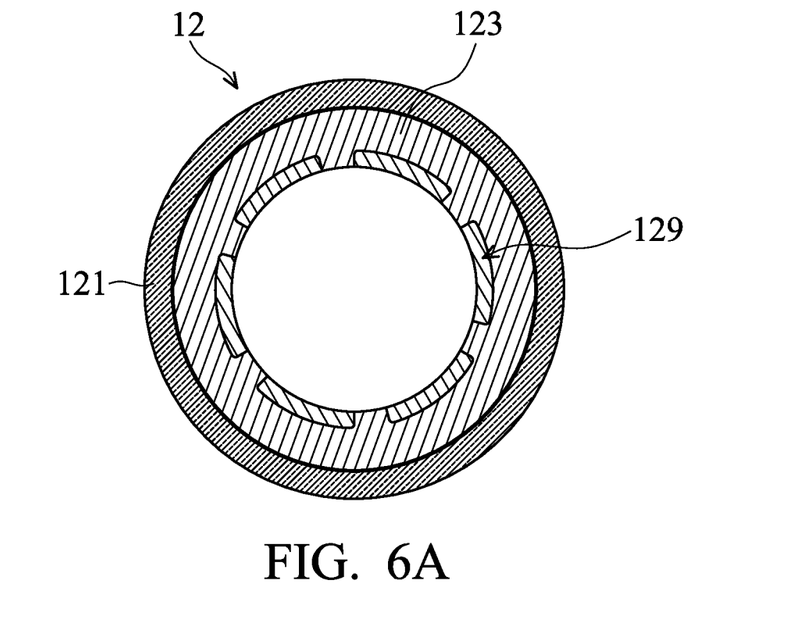
FIG. 6A is a schematic radial-sectional view of the stator module in FIG. 4A.
Figure 6B:
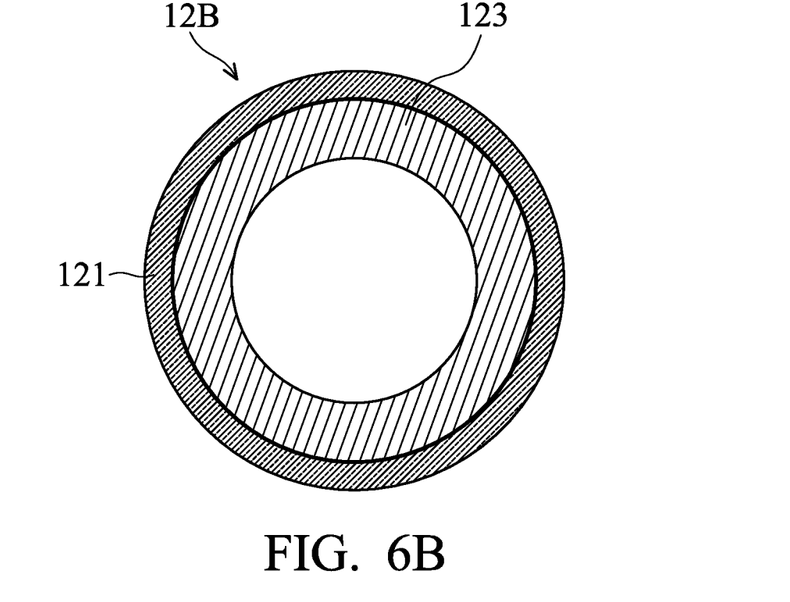
FIG. 6B is a schematic radial-sectional view of a stator module in accordance with another embodiment of the present disclosure.

FIGS. 6A and 6B are schematic radial-sectional views of the stator modules 12 and 12B, respectively. As shown in FIG. 6A, the motor core 123 is disposed on the inner side of the coreless coil 121. The motor core 123 has an inner surface, and the inner surface forms a plurality of grooves 129 to avoid rotation after the packaging material 124 covers the motor core 123. Furthermore, as shown in FIG. 6B, the inner surface of the motor core 123 is a smooth surface.

Figure 7A:
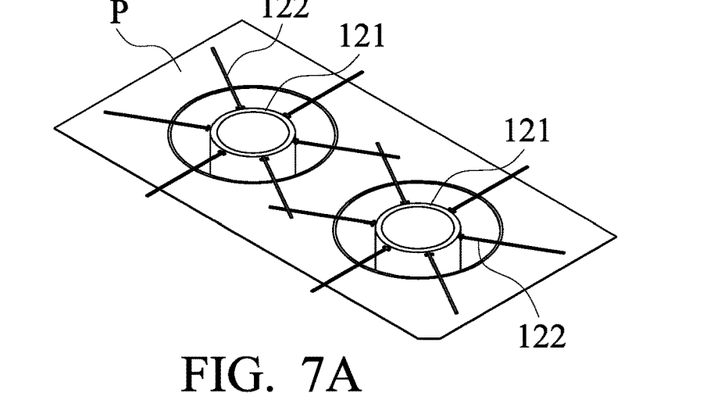
FIGS. 7A-7C are steps of a manufacturing method of the stator module in FIG. 4A or FIG. 4B.
Figure 7B:
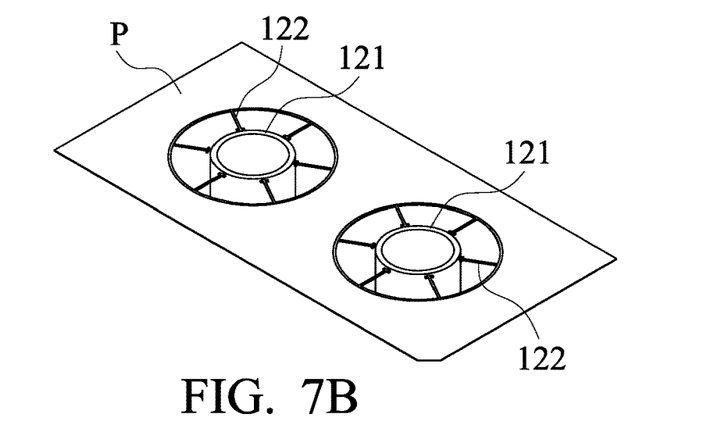
Figure 7C:
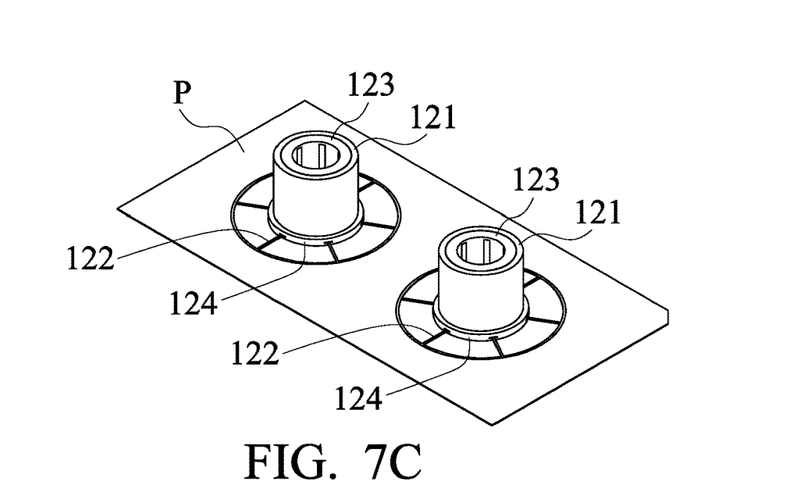

FIGS. 7A-7C show steps of a manufacturing method of the stator modules 12 and 12A. As shown in FIG. 7A, the first step is disposing at least a coreless coil 121 on a lead frame plate P with at least a lead frame 122. The second step as shown in FIG. 7B is electrically connecting the six pins 122P of the coreless coil 121 to the corresponding lead frame 122, for example, by welding, and cutting the unnecessary portion of the lead frame 122. The third step as shown in FIG. 7C is disposing a motor core 123 on an inner side of the coreless coil 121 and packaging the coreless coil 121, the bottom of the motor core 123 and the lead frame 122 by a packaging material 124 to form a stator module plate. The final step is cutting the stator module plate to form a stator module 12 or 12A. The process of manufacturing the stator module could be automatic by the above-mentioned steps.

In addition, the present disclosure further provides a manufacturing method of brushless DC motor fans as shown in FIG. 1A to 3B. The steps includes providing a rotor 10 with a shaft 104 and disposing the shaft 104 on an inner side of the stator module 12. The stator module 12 is manufactured by the above-mentioned steps in FIGS. 7A to 7C. Next, the step includes connecting the stator module 12 to a circuit board 15. It should be understood that the above-mentioned six pins 122P of the stator module 12 have various structures depend on different ways to electrically connecting. If the six pins 122P pass through the base 141 and are electrically connected to the circuit board 15, the six pins 122P are formed by bending the lead frame 122 as shown in FIG. 4A. If the six pins 122P are electrically connected to the circuit board 15 by surface mount technology, the six pins 122P are formed by packaging the lead frame 122 into surface mount device as shown in FIG. 4B.

In summary, utilizing the brushless DC motor fan of the embodiments of the present disclosure, the problem of poor assembling accuracy due to manual assembly is prevented. Additionally, the brushless DC motor fan of the embodiments of the present disclosure can be produced by an automatic process which reduces the labor time and the required manpower, and enhances productivity.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A brushless DC motor fan, comprising:
a rotor, including a shaft; and
a stator module, wherein the shaft is disposed on an inner side of the stator module and rotates relative to the stator module, and the stator module includes:
a coreless coil; and
a lead frame, including six pins, wherein the six pins are electrically connected to the coreless coil, and the six pins are surface mount device,
wherein as seen from a longitudinal axis of the shaft, the six pins are arranged within the rotor.

2. The brushless DC motor fan of claim 1, wherein the rotor further includes a magnet disposed on the inner side of the stator module.

3. The brushless DC motor fan of claim 1, wherein the rotor further includes a magnet disposed corresponding to the stator module.

4. The brushless DC motor fan of claim 1, wherein the brushless DC motor fan further comprises:
a case, having a base; and
a circuit board;
wherein the coreless coil is disposed on a side of the base, and the six pins are electrically connected to the circuit board.

5. The brushless DC motor fan of claim 4, wherein the circuit board and the coreless coil are disposed on the same side of the base.

6. The brushless DC motor fan of claim 5, wherein the circuit board has an opening to receive the shaft.

7. The brushless DC motor fan of claim 4, wherein the circuit board and the coreless coil are disposed on the opposite sides of the base.

8. The brushless DC motor fan of claim 7, wherein the circuit board has a plurality of holes to receive the six pins.

9. The brushless DC motor fan of claim 1, wherein the stator module further includes a motor core disposed on the inner side of the stator module and between the coreless coil and the shaft.

10. The brushless DC motor fan of claim 9, wherein the motor core has an inner surface forming a plurality of grooves.

11. A manufacturing method of a brushless DC motor fan, comprising:
providing a coreless coil;
providing a lead frame plate having a lead frame, disposing the coreless coil on the lead frame plate, and electrically connecting the coreless coil to the lead frame;
packaging the coreless coil and the lead frame to form a stator module plate;
cutting the stator module plate to form a stator module;
providing a rotor having a shaft, and disposing the shaft on an inner side of the stator module; and
providing a circuit board, and electrically connecting the stator module to the circuit board, wherein the stator module is electrically connected to the circuit board via six pins, wherein the six pins are surface mount device, and as seen from a longitudinal axis of the shaft, the six pins are arranged within the rotor.

12. The manufacturing method of a brushless DC motor fan of claim 11, wherein the coreless coil is electrically connected to the lead frame by welding.

13. The manufacturing method of a brushless DC motor fan of claim 11, further comprising:
providing a motor core, disposing the motor core on an inner side of the coreless coil, and packaging the coreless coil and the lead frame to form the stator module plate.

14. The manufacturing method of a brushless DC motor fan of claim 13, wherein the motor core has an inner surface forming a plurality of grooves.

15. The manufacturing method of a brushless DC motor fan of claim 11, wherein the circuit board has an opening to receive the shaft.

16. The manufacturing method of a brushless DC motor fan of claim 11, wherein the circuit board has a plurality of holes to receive the six pins.

17. The brushless DC motor fan of claim 9, wherein the motor core is separated from the lead frame.

18. The brushless DC motor fan of claim 1, wherein each of the six pins has a rectangular structure.

\* \* \* \* \*